US012652812B2

(12) United States Patent
Rascuna' et al.

(10) Patent No.: US 12,652,812 B2
(45) **Date of Patent: \*Jun. 9, 2026**

(54) FORMING AN ELECTRONIC DEVICE, SUCH AS A JBS OR MPS DIODE, BASED ON 3C-SIC, AND 3C-SIC ELECTRONIC DEVICE

(71) Applicant: STMICROELECTRONICS S.r.l., Agrate Brianza (IT)

(72) Inventors: Simone Rascuna', Catania (IT); Fabrizio Roccaforte, Mascalucia (IT); Gabriele Bellocchi, Catania (IT); Marilena Vivona, Calatafimi Segesta (IT)

(73) Assignee: STMICROELECTRONICS S.r.l., Agrate Brianza (IT)

( \* ) Notice: Subject to any disclaimer, the term of this patent is extended or adjusted under 35 U.S.C. 154(b) by 491 days.

This patent is subject to a terminal disclaimer.

(21) Appl. No.: 18/180,680

(22) Filed: Mar. 8, 2023

(65) Prior Publication Data

US 2023/0299173 A1      Sep. 21, 2023

(30) Foreign Application Priority Data

Mar. 18, 2022    (IT) ........................ 102022000005363

(51) Int. Cl.
H10D 8/01        (2025.01)
H10D 8/50        (2025.01)
(Continued)

(52) U.S. Cl.
CPC .............. H10D 8/051 (2025.01); H10D 8/50 (2025.01); H10D 8/60 (2025.01); (Continued)

(58) Field of Classification Search
CPC ............ H10D 8/051; H10D 8/50; H10D 8/60; H10D 62/8325; H10D 62/106;
(Continued)

(56) References Cited

U.S. PATENT DOCUMENTS

2013/0240906 A1      9/2013   Shimizu et al.
2014/0264384 A1\*    9/2014   Loboda ............. H01L 21/02378
                                                              257/77
(Continued)

FOREIGN PATENT DOCUMENTS

CN        113809183  A      12/2021
JP        2009188133  A      8/2009
JP        2013093440  A      5/2013

OTHER PUBLICATIONS

Choi et al., "Laser-induced phase separation of silicon carbide," *Nature Communications* 713562, 2016. (7 pages).
(Continued)

*Primary Examiner* — Alexander G Ghyka
(74) *Attorney, Agent, or Firm* — Seed Intellectual Property Law Group LLP

(57) ABSTRACT

Method for manufacturing an electronic device, comprising the steps of: forming, at a front side of a solid body of 4H-SiC having a first electrical conductivity, at least one implanted region having a second electrical conductivity opposite to the first electrical conductivity; forming, on the front side, a 3C-SiC layer; and forming, in the 3C-SiC layer, an ohmic contact region which extends through the entire thickness of the 3C-SiC layer, up to reaching the implanted region. A silicon layer may be present on the 3C-SiC layer; in this case, the ohmic contact also extends through the silicon layer.

20 Claims, 10 Drawing Sheets

(51) Int. Cl.

| | |
|---|---|
| *H10D 8/60* | (2025.01) |
| *H10D 62/832* | (2025.01) |
| *H10D 64/01* | (2025.01) |
| *H10P 30/20* | (2026.01) |
| *H10P 34/42* | (2026.01) |
| *H10P 50/00* | (2026.01) |
| *H10P 95/90* | (2026.01) |

(52) U.S. Cl.
CPC ......... *H10D 62/8325* (2025.01); *H10D 64/01* (2025.01); *H10P 30/2042* (2026.01); *H10P 30/21* (2026.01); *H10P 34/42* (2026.01); *H10P 50/00* (2026.01); *H10P 95/90* (2026.01)

(58) Field of Classification Search
CPC ............. H10D 64/01; H10D 64/01366; H10D 64/0115; H10D 64/0123; H10P 30/2042; H10P 30/21; H10P 14/22; H10P 14/279; H10P 14/36; H10P 14/3816; H10P 14/2904; H01L 21/02631; H01L 21/02653; H01L 21/02686; H01L 21/0445
See application file for complete search history.

(56) References Cited

U.S. PATENT DOCUMENTS

| | | | |
|---|---|---|---|
| 2017/0213909 A1* | 7/2017 | Henson .............. | H10D 30/0297 |
| 2021/0328023 A1 | 10/2021 | Rascunáet al. | |
| 2022/0165876 A1* | 5/2022 | Steinmann ......... | H10D 62/8325 |
| 2023/0024105 A1* | 1/2023 | Schustereder ...... | H01L 21/0485 |
| 2023/0298887 A1 | 9/2023 | Bellocchi et al. | |

OTHER PUBLICATIONS

Eriksson et al., "Toward an ideal Schottky barrier on 3C-SiC," *Applied Physics Letters* 95:081907, 2009. (3 pages).

Jokubavicius et al., "Lateral Enlargement Growth Mechanism of 3C-SiC on Off-Oriented 4H-SiC Substrates," *Cryst. Growth Des.* 14:6514-6520, 2014.

Jokubavicius et al., "Single Domain 3C-SiC Growth on Off-Oriented 4H-SiC Substrates," *Cryst. Growth Des.* 15:2940-2947, 2015.

Soueidan et al., "A Vapor-Liquid-Solid Mechanism for Growing 3C-SiC Single-Domain Layers on 6H-SiC(001)," *Advanced Functional Materials* 16:975-979, 2006.

Yakimova et al., "Growth, Defects and Doping of 3C-SiC on Hexagonal Polytypes," *ECS J. Solid State Sci. Technol.* 6(10):P741-P745, 2017. (6 pages).

* cited by examiner

FORMING AN ELECTRONIC DEVICE, SUCH AS A JBS OR MPS DIODE, BASED ON 3C-SIC, AND 3C-SIC ELECTRONIC DEVICE

BACKGROUND

Technical Field

The present disclosure relates to an electronic device formed, at least in part, in 3C-SiC and to a method for manufacturing the 3C-SiC electronic device.

Description of the Related Art

As is known, semiconductor materials, which have a wide bandgap, in particular, which have an energy value Eg of the bandgap greater than 1.1 eV, low on-state resistance (RON), high value of thermal conductivity, high operating frequency and high saturation velocity of charge carriers, are ideal for producing electronic components, such as diodes or transistors, in particular for power applications. A material having the characteristics, and designed to be used for manufacturing electronic components, is silicon carbide (SiC). Silicon carbide comes in different crystalline forms, also called polytypes. The most common polytypes are the cubic polytype (polytype 3C-SiC), the hexagonal polytype (polytypes 4H-SiC and 6H-SiC) and the rhombohedral polytype (polytype 15R-SiC).

Electronic devices provided on a silicon carbide substrate, as compared to similar devices provided on a silicon substrate, have numerous advantages, such as low output resistance in conduction, low leakage current, high working temperature, and high operating frequencies. In particular, SiC Schottky diodes have demonstrated higher switching performances, making SiC electronic devices particularly favorable for high frequency applications. Current applications impose demands on electrical properties and also on long-term reliability of devices.

Owing to a greater ease of manufacturing with respect to other polytypes, 4H-SiC is commonly used as a substrate. However, the bandgap of 4H-SiC is greater (3.2 eV) with respect to the corresponding bandgap of 3C-SiC (2.3 eV) or silicon (1.12 eV), making 4H-SiC less attractive to some electronic applications with respect to 3C-SiC or with respect to silicon. For example, in case of Schottky barrier diodes, the possibility of controlling the Schottky Barrier Height (SBH) value is an important aspect in order to reduce energy consumption and minimize conduction losses. To this end, the implementation of metal/3C-SiC or metal/Si contacts results in lower SBH values with respect to the SBH values of metal/4H-SiC contacts, enabling the manufacturing of more efficient Schottky diodes.

Moreover, the breakdown voltage of SiC is also greater than that of silicon. This is due to the fact that the critical electric field of SiC is about ten times greater than that of silicon. In general, a further advantage associated with the manufacturing of a device on a substrate (bulk) of 4H-SiC is maintaining the advantage in breakdown voltage, but having on the surface a material with a lower bandgap (for example, silicon or 3C-SiC), so as to have a reduction in the barrier height, for example, of the Schottky contact. In other words, maintaining the advantage in reverse bias and optimizing the voltage drop in forward bias is desirable.

FIG. 1 shows, in lateral sectional view in a Cartesian (triaxial) reference system of X, Y, Z axes, a Junction Barrier Schottky (JBS) device, or similarly a Merged-PN-Schottky (MPS) diode, identified with the reference number 1. The device of FIG. 1 is not necessarily known art, and reference will be made hereinafter to a JBS device 1 without thereby losing generality.

The JBS device 1 includes: a substrate 3, of N-type doped 4H-SiC, having a first dopant concentration (e.g., between $1 \cdot 10^{19}$ and $1 \cdot 10^{22}$ atoms/cm$^3$), resistivity, for example, between 2 mΩ·cm and 40 mΩ·cm, provided with a surface 3a opposite to a surface 3b, and a thickness between 50 μm and 350 μm, more particularly between 160 μm and 200 μm, for example equal to 180 μm; a drift layer (epitaxially grown) 2, of N-type 4H-SiC, having a second dopant concentration lower than the first dopant concentration (for example between $1 \cdot 10^{14}$ and $5 \cdot 10^{16}$ atoms/cm$^3$), which extends on the surface 3a of the substrate 3, and a thickness between 5 and 15 μm; an ohmic contact region 6 (for example of Nickel Silicide), which extends on the surface 3b of the substrate 3; a cathode metallization 7, for example of Ti/NiV/Ag or Ti/NiV/Au, which extends on the ohmic contact region 6; an anode metallization 8, for example of Ti/AlSiCu or Ni/AlSiCu, which extends on a top surface 2a of the drift layer 2; a passivation layer 19 on the anode metallization 8, to protect the latter; a plurality of Junction-Barrier (JB) elements 9 in the drift layer 2, facing the top surface 2a of the drift layer 2 and each including a respective implanted region 9' of P-type and an ohmic contact 9''; and an edge termination region, or protection ring, 10 (optional), in particular a P-type implanted region, which surrounds (completely or partially, depending on the design options) the JB elements 9.

Schottky diodes 12 are formed at the interface between the drift layer 2 and the anode metallization 8. In particular, Schottky (semiconductor-metal) junctions are formed by portions of the drift layer 2 in direct electrical contact with respective portions of the anode metallization 8.

The region of the JBS device 1 including the JB elements 9 and the Schottky diodes 12 (i.e., the region contained within the protection ring 10) is an active area 4 of the JBS device 1.

With reference to FIGS. 2A and 2B, the manufacturing steps of the JBS device 1 of FIG. 1 provide (FIG. 2A) for a step of masked implant of doping species which have the second conductivity type (P), for example boron or aluminum, in the drift layer 2. The implant is illustrated with arrows 18 in FIG. 2A. A mask 11 is used for the implant, in particular a hard mask of silicon oxide or TEOS. In an exemplary embodiment, the implant step includes one or more implants of doping species, which have the second conductivity type, with implant energy between 30 ke V and 400 keV and with doses between $1 \cdot 10^{12}$ atoms/cm$^2$ and $1 \cdot 10^{15}$ atoms/cm$^2$.

Implanted regions 9' and the edge termination region 10 are thus formed. The implanted regions 9' and the edge termination region 10 have a depth, measured from the surface 2a, between 0.2 μm and 1 μm.

Then, FIG. 2B, the mask 11 is removed and a thermal annealing step is performed for the activation of the doping species implanted in the step of FIG. 2A. The thermal annealing is, for example, performed in a furnace at a temperature higher than 1600° C. (for example, between 170° and 1900° C. and in some cases even higher).

With reference to FIGS. 3A-3C, further steps are then performed for forming the ohmic contacts 9''. With reference to FIG. 3A, a deposition mask 13 of silicon oxide or TEOS is formed, to cover surface regions of the drift layer 2 other than the implanted regions 9' (and of the edge termination 10, if any). In other words, the mask 13 has through openings 13a at the implanted regions 9' (and optionally at least one portion of the edge termination 10). Then, FIG. 3B, a Nickel deposition is performed on the mask 13 and inside the through openings 13*a* (metal layer 14 in FIG. 3B). The Nickel thus deposited reaches and contacts the implanted regions 9' and the edge termination region 10 through the through openings 13*a*.

With reference to FIG. 3C, a subsequent thermal annealing at a high temperature (between 700° C. and 1200° C. for a time interval from 1 minute to 120 minutes), allows ohmic contacts 9" of Nickel Silicide to be formed, by chemical reaction between the deposited Nickel and the silicon carbide (4H-SiC) of the drift layer 2 at the through openings 13*a*. In fact, the deposited Nickel reacts where it is in contact with the surface material of the drift layer 2, forming $Ni_2Si$ (i.e., the ohmic contact). Subsequently, a step of removing the metal which extends above the mask 13 and a removal of the mask 13 are performed.

After forming the ohmic contacts, the method proceeds forming (e.g., by deposition) the anode metallization 8, for example of Ti/AlSiCu or Ni/AlSiCu, on the top surface 2*a* of the drift layer 2 and in direct electrical contact with the ohmic contacts 9". Then, the passivation layer 19 is formed on the anode metallization 8, to protect the latter. Consequently, respective Schottky diodes 12 are formed at the interface between the drift layer 2 and the anode metallization 8, lateral to the implanted regions 9'. In particular, Schottky (semiconductor-metal) junctions are formed by portions of the drift layer 2 in direct electrical contact with respective portions of the anode metallization 8, between the JB elements 9.

BRIEF SUMMARY

Embodiments of the present disclosure provide an electronic device formed, at least in part, in 3C-SiC and a method for manufacturing the 3C-SiC electronic device, such as to overcome the drawbacks of the prior art.

According to the present disclosure, a method for manufacturing an electronic device and an electronic device are provided.

In one embodiment, a method for manufacturing an electronic device includes forming, at a front side of a solid body of 4H-SiC having a first electrical conductivity, at least one implanted region having a second electrical conductivity opposite to the first electrical conductivity. The method includes forming, on the front side, a 3C-SiC layer and forming, in the 3C-SiC layer, an ohmic contact region extending through an entire thickness of the 3C-SiC layer, up to reaching the implanted region.

In one embodiment, an electronic device includes a solid body of 4H-SiC having a first electrical conductivity. The electronic device includes at least one implanted region having a second electrical conductivity opposite to the first electrical conductivity extending at a front side of the solid body. The electronic device includes a 3C-SiC layer on the front side and an ohmic contact region through an entire thickness of the 3C-SiC layer, up to reaching the implanted region.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIG. 4 shows, in lateral sectional view in the Cartesian (triaxial) reference system of X, Y, Z axes of FIG. 1, a JBS device 50, according to an embodiment. The view of FIG. 4 may similarly relate to an MPS device (diode) (hereinafter reference will be made exclusively to a JBS device without thereby losing generality).

DETAILED DESCRIPTION

Figure 1:
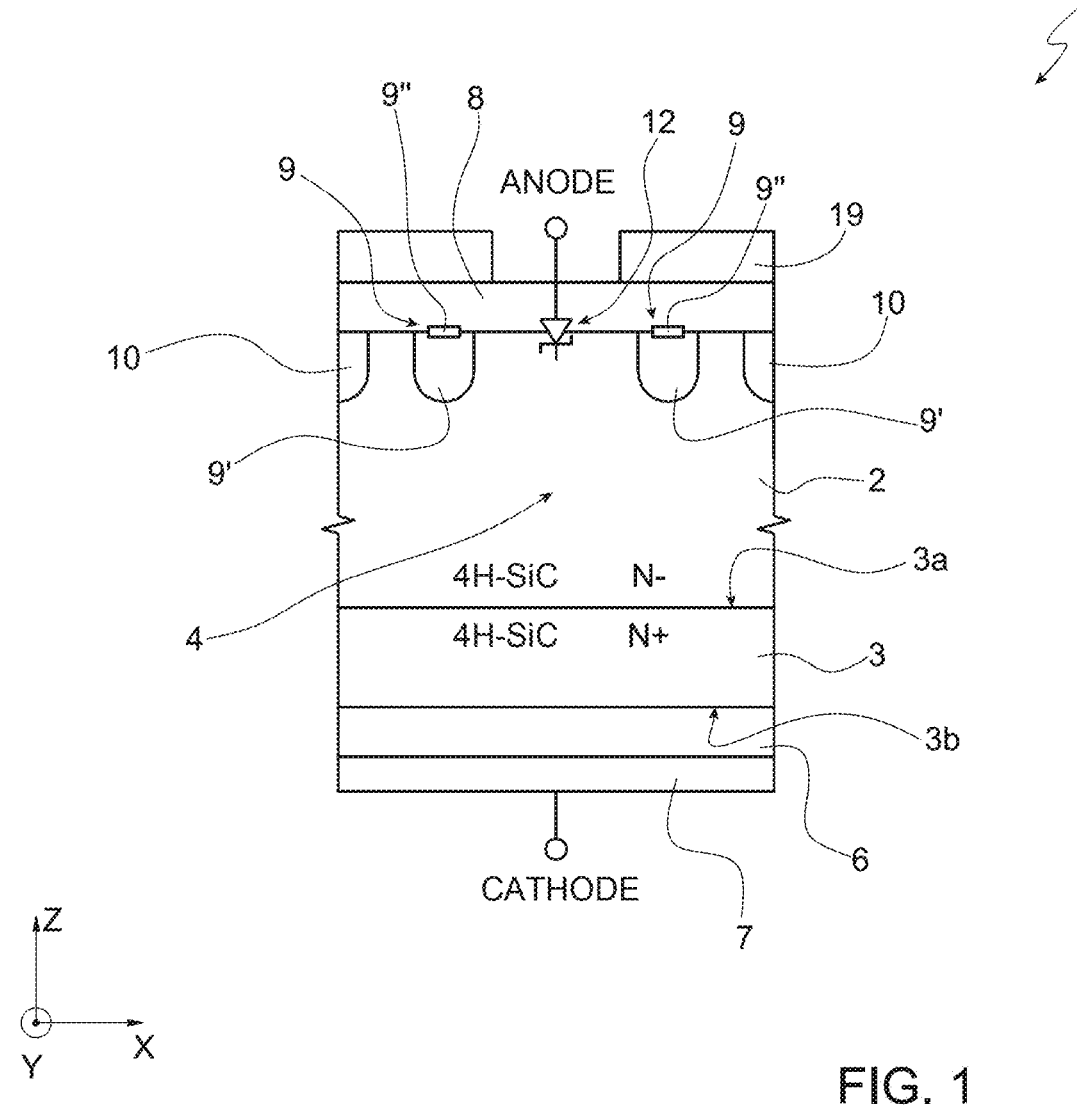
FIG. 1 shows, in cross-sectional view, a JBS or MPS device according to an embodiment.

Elements common to the JBS device 1 of FIG. 1 are identified with the same reference numbers and are may not be further described.

The JBS device 50 includes: the substrate 3, of N-type 4H-SiC, having the first dopant concentration; the (epitaxial) drift layer 2, of N-type 4H-SiC, having the second dopant concentration; a cubic silicon carbide (3C-SiC) layer 52 on the surface 2*a*; the anode metallization 8, for example of Ti/AlSiCu or Ni/AlSiCu, which extends on the 3C-SiC layer 52; the passivation layer 19 on the anode metallization 8; the plurality of implanted regions 9' in the drift layer 2, facing the top surface 2*a* of the drift layer 2, at the interface with the 3C-SiC layer 52; a plurality of ohmic contacts 54, extending through the 3C-SiC layer at respective implanted regions 9' and forming, with the latter, respective JB elements 59; the edge termination region, or protection ring, 10 (optional), in particular a P-type implanted region, which completely or partially surrounds the JB elements 9; the ohmic contact region, or layer, 6 (for example of Nickel Silicide), which extends on the surface 3*b* of the substrate 3; the cathode metallization 7, for example of Ti/NiV/Ag or Ti/NiV/Au, which extends on the ohmic contact region 6.

One or more Schottky diodes 57 extend at the interface between the 3C-SiC layer 52 and the anode metallization 8, lateral to the implanted regions 9'. In particular, one or more Schottky (semiconductor-metal) junctions are formed by portions of the 3C-SiC layer 52 in direct electrical contact with respective portions of the anode metallization 8.

The region of the JBS device 50 which includes the JB elements 59 and the Schottky diodes 57 (i.e., the region contained within the protection ring 10, if any) is the active area 4 of the JBS device 50.

Figure 3A:
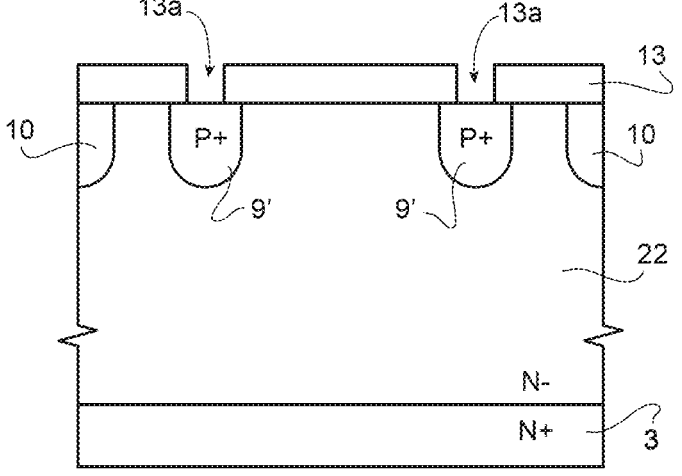
FIGS. 3A-3C show, in cross-sectional view, steps for forming ohmic contacts of the device of FIG. 1, subsequently to the steps of FIGS. 2A and 2B, according to an embodiment.
Figure 3B:
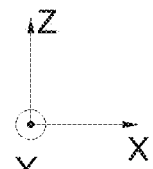
Figure 3B:
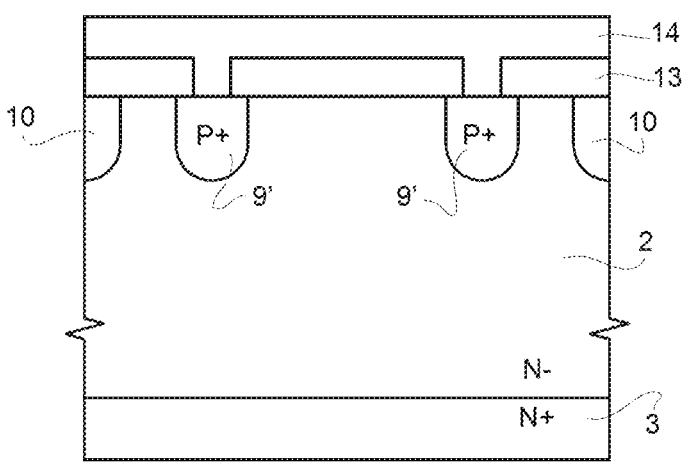
Figure 3C:
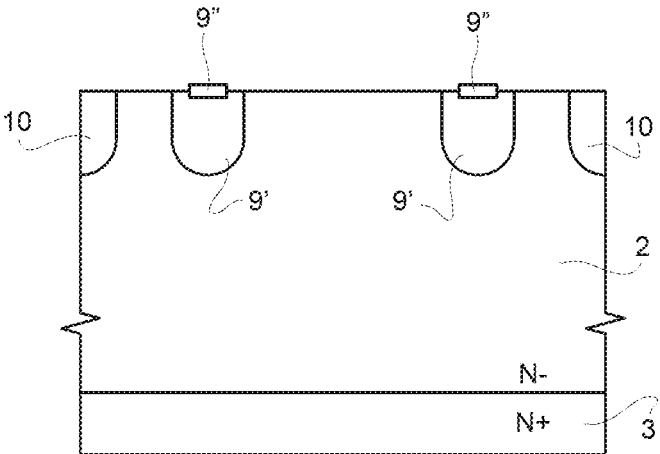
Figure 4:
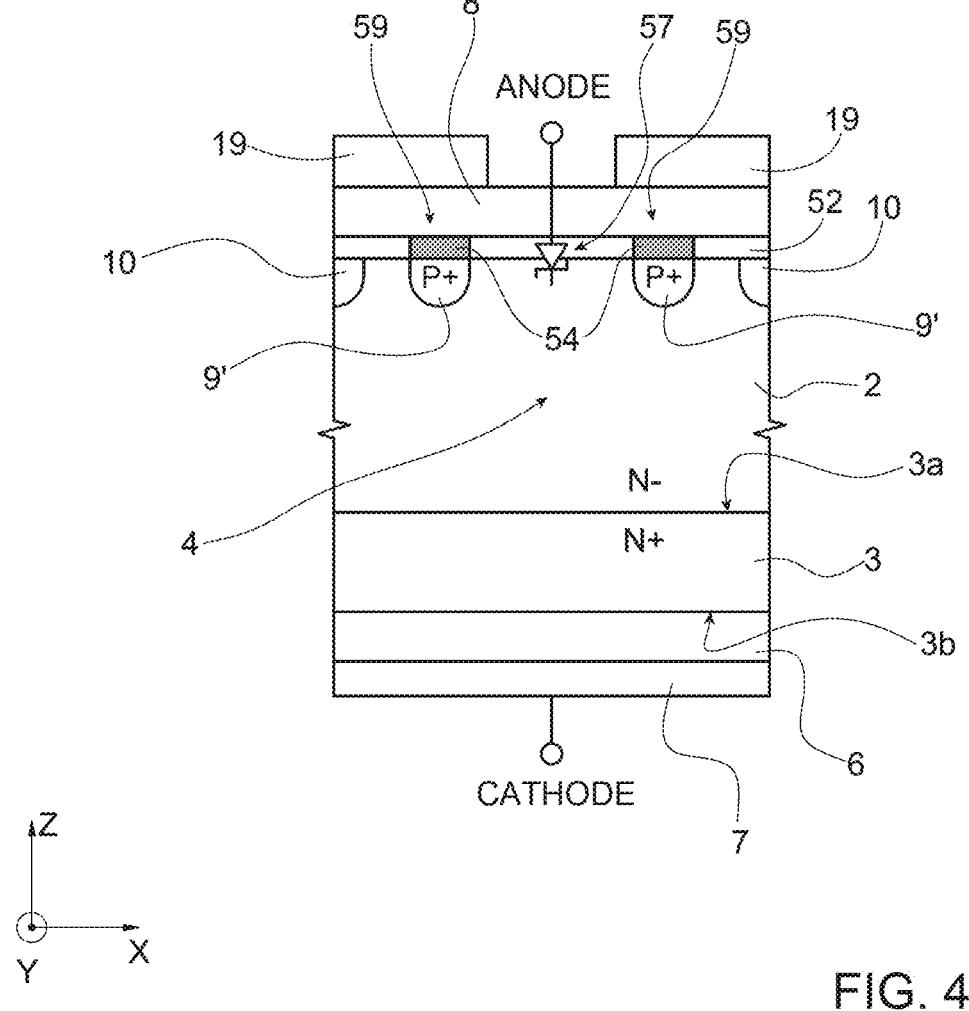
FIG. 4 shows, in cross-sectional view, a JBS or MPS device according to an embodiment.
Figure 5A:
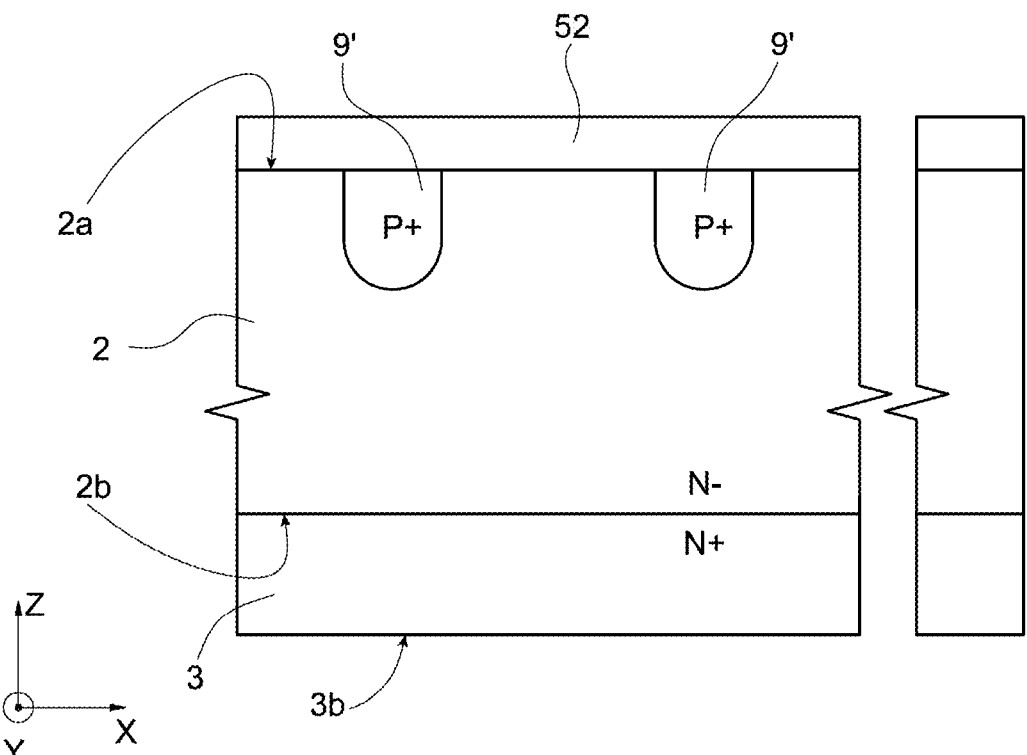
FIGS. 5A and 5B show, in cross-sectional view, intermediate manufacturing steps of the device of FIG. 4, according to an embodiment.
Figure 5B:
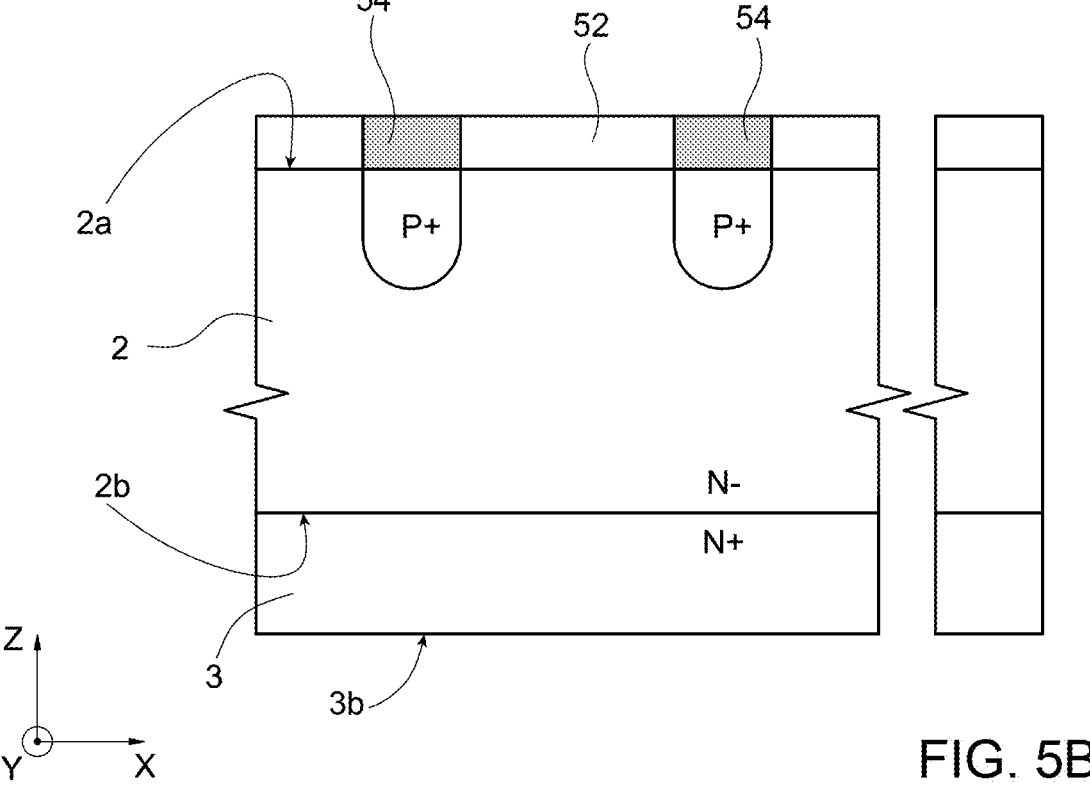

FIGS. 5A and 5B show, in lateral sectional view in the Cartesian (triaxial) reference system of X, Y, Z axes of FIGS. 2A-2B, 3A-3C and 4, intermediate manufacturing steps of the JBS device 50, according to an embodiment of the present disclosure.

Figure 2A:
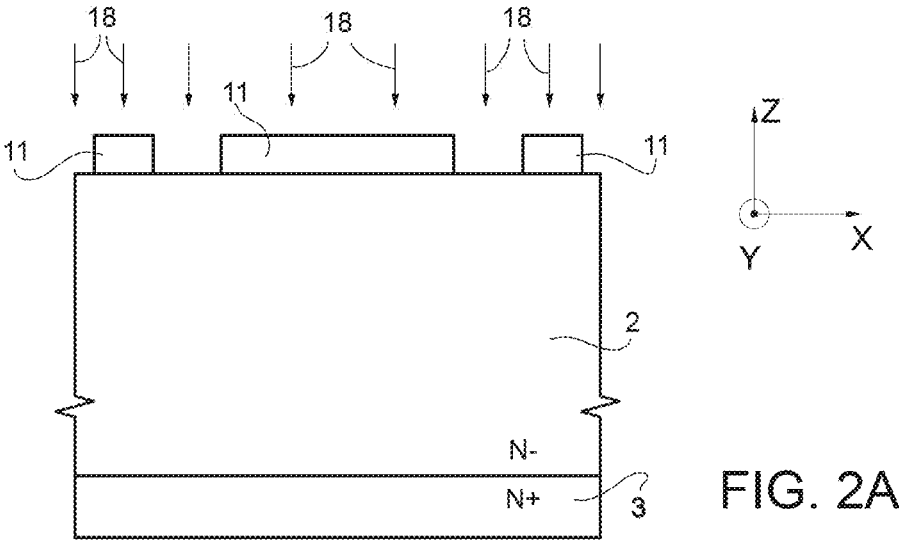
FIGS. 2A and 2B show, in cross-sectional view, intermediate manufacturing steps of the device of FIG. 1, according to an embodiment.
Figure 2B:
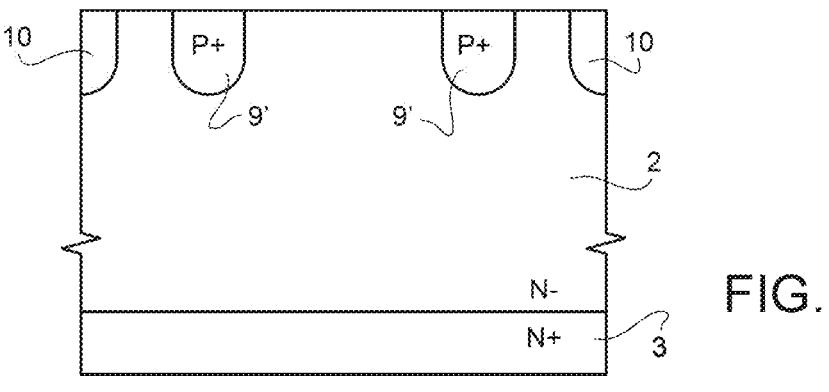

In particular, after performing the steps of FIGS. 2A and 2B (not further described herein), a step of forming (e.g., growing) a cubic silicon carbide (3C-SiC) layer 52 on the surface 2a of the drift layer 2 is performed, as illustrated in FIG. 5A.

The growth of 3C-SiC on a 4H-SiC substrate/layer is known per se. A method for this purpose is known as the Vapor-Liquid-Solid (VLS) mechanism, for example described by Soucidan M. et al., "A Vapor-Liquid-Solid Mechanism for Growing 3C-SiC Single-Domain Layers on 6H-SiC(0001)," Advanced Functional Materials, vol. 16, pages 975-979, 2 May 2006.

Another method is known as Sublimation Epitaxy (SE), for example described by Valdas Jokubavicius et al., "Lateral Enlargement Growth Mechanism of 3C-SiC on Off-Oriented 4H-SiC Substrates," Crystal Growth & Design 2014 14 (12), 6514-6520.

Another method is known from Rositsa Yakimova et al., "Growth, Defects and Doping of 3C-SiC on Hexagonal Polytypes," ECS Journal of Solid State Science and Technology, Volume 6, Number 10, p. 741, November 2017.

Then, the method proceeds, FIG. 5B, with a step of forming the ohmic contacts 54, exploiting the process already described with reference to FIGS. 3A-3C, adapted to the embodiment of FIG. 5B. In particular, in this case, the mask 13 is formed on the 3C-SiC layer 52 and the through openings 13a extend up to reaching the 3C-SiC layer 52. Therefore, the metal layer 14 extends up to reaching the 3C-SiC layer 52.

After the step of FIG. 5B, the method proceeds with steps of forming (e.g., by deposition) the anode metallization 8, for example of Ti/AlSiCu or Ni/AlSiCu, on the 3C-SiC layer 52, in direct electrical contact with the ohmic contacts 54. Then, the passivation layer 19 is formed on the anode metallization 8, to protect the latter. Consequently, respective Schottky diodes 57 are formed at the interface between the 3C-SiC layer 52 and the anode metallization 8, lateral to the ohmic contacts 57.

FIGS. 6A-6D illustrate a further method for forming the 3C-SiC layer 52.

In this case, the step of forming the cubic silicon carbide (3C-SiC) layer 52 on the surface 2a of the drift layer 2 may occur by melting and resolidification (crystallization) of the 4H-SiC material of the drift layer 2, for example as described by Choi, I., Jeong, H., Shin, H. et al., "Laser-induced phase separation of silicon carbide," Nature Communications 7, 13562 (2016).

Figure 6A:
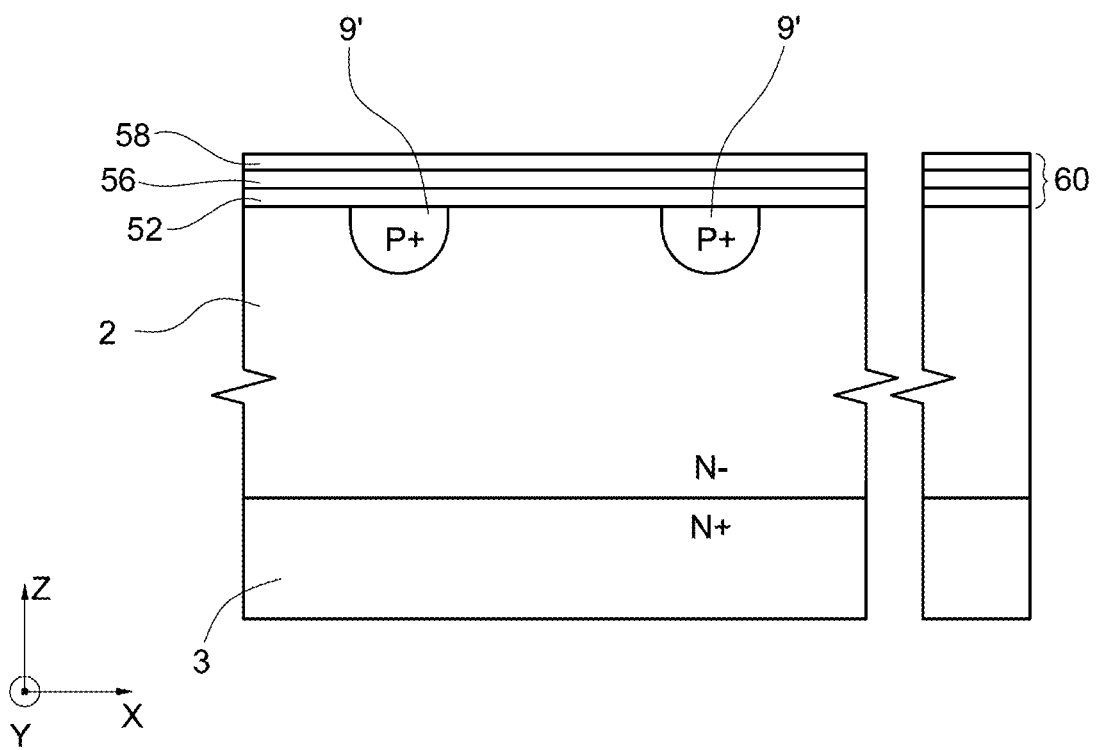
FIGS. 6A-6D show, in cross-sectional view, intermediate manufacturing steps of the device of FIG. 4, according to an embodiment.

As illustrated in FIG. 6A, this process leads to the formation of a stack 60 including: the 3C-SiC layer 52 on the drift layer 2 of 4H-SiC; a silicon layer 56 on the 3C-SiC layer 52; and a carbon-rich (for example Graphite) layer 58 on the silicon layer 56. In one embodiment, the 3C-SiC layer 52 has a thickness between 10 and 200 nm, the silicon layer 56 has a thickness between 5 and 100 nm and the carbon-rich layer has a thickness between 5 and 100 nm.

Since this process entails a crystallographic change of a portion of the drift layer 2 at the top surface 2a, after the formation of the stack 60 the drift layer 2 has a reduced thickness. This melting and crystallization step does not damage the implanted regions 9' from an electrical or functional point of view.

The 3C-SiC layer 52 and the silicon layer 56 have substantially the same doping as the drift layer 2 of 4H-SiC, since the melting and crystallization step does not entail a modification of the dose of dopants already present in the drift layer 2.

The melting of the 4H-SiC material of the drift layer 2 is performed, in particular, through LASER, whose configuration and operating parameters are the following: wavelength between 240 and 700 nm, in particular 308 nm; pulse duration between 20 ns and 500 ns, in particular 160 ns; number of pulses between 1 and 16, in particular 4; energy density between 1.6 and 4 J/cm$^2$, in particular 2.6 J/cm$^2$. (considered at the level of the top surface 2a); temperature between 1400° C. and 2600° C., in particular 2200° C. (considered at the level of the surface 2a).

The area of the spot of the beam 102 at the level of the front side 2a is, for example, between 0.7 and 1.5 cm$^2$.

After the melting step, the crystallization of the portion(s) being melted occurs at a temperature between 160° and 2600° C. for a time between 200 and 600 ns. The stack 60, previously described, is thus formed.

Figure 6B:
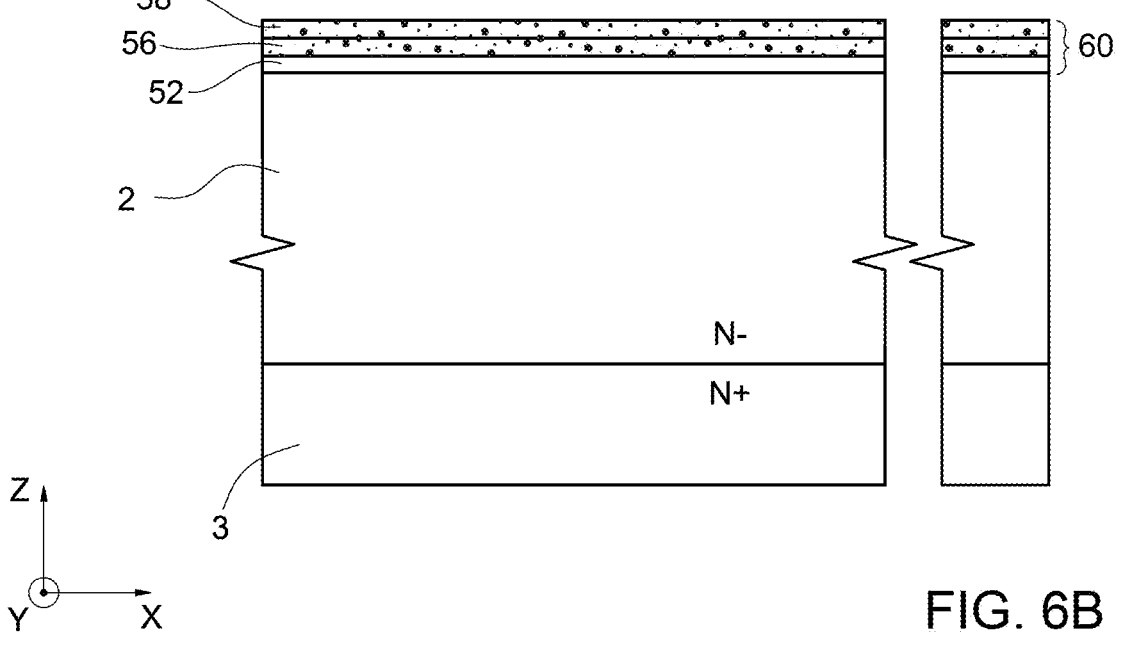

Then, FIG. 6B, an oxidation step of the carbon-rich layer 58 and of the underlying silicon layer 56 is performed, forming respective oxidized layers. This step is performed by inserting the wafer into a furnace at a temperature of 800° C. for 60 min. This favors the oxidation of both the carbon-rich layer 58 and the silicon layer 56. A corresponding oxidation of the 3C-SiC layer 52 and of the 4H-SiC material of the substrate 3 and of the epitaxial layer 2 may not occur.

Figure 6C:
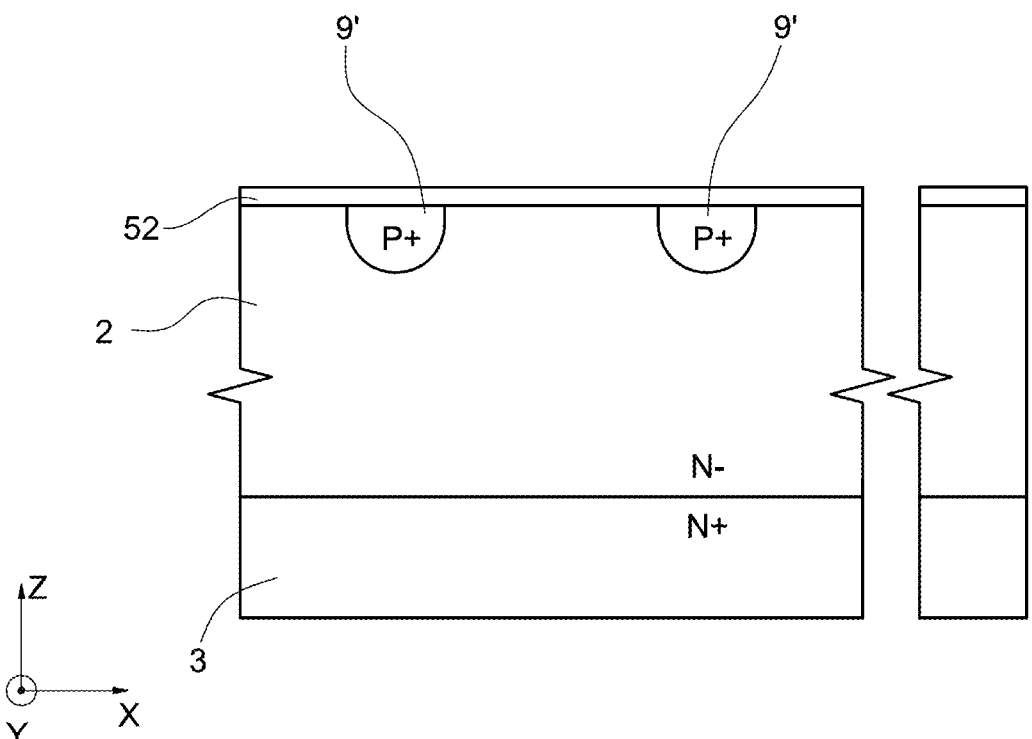

Then, FIG. 6C, a subsequent bath in a suitable wet etching solution, such as for example BOE (Buffered Oxide Etchant), allows the complete removal of the oxidized layers in the step of FIG. 6B, exposing the 3C-SiC layer 52. Since the etching chemical solution selectively removes the material of the layers 56, 58 that have been oxidized, the etching proceeds until such oxidized layers are completely removed, without removing the underlying 3C-SiC layer 52.

Then, FIG. 6D, the ohmic contacts 54 are formed through the 3C-SiC layer 52, at the implanted regions 9' (and possibly at the protection ring 10, if any), according to what has already been described with reference to FIG. 5B (that is, following the process of FIGS. 3A-3C, with the suitable modifications already discussed).

Using a suitably configured LASER source, it is possible to simultaneously melt the surface portion of the drift layer 2 (to form the 3C-SiC layer 52 as described above) and activate the doping species of the implanted regions 9'. The relevant LASER configuration parameters are the following: an energy density equal to, or greater than, 2.4 J/cm$^2$ (considered at the level of the top surface 2a), a number of pulses between 1 and 16, for example equal to 4, a time duration of each pulse between 20 and 500 ns, for example equal to 160 ns, and a wavelength of the emitted radiation between 240 and 700, for example equal to 308 nm.

In this embodiment, the step of activating the dopants in the furnace described with reference to FIG. 2B, may be omitted.

Figure 6D:
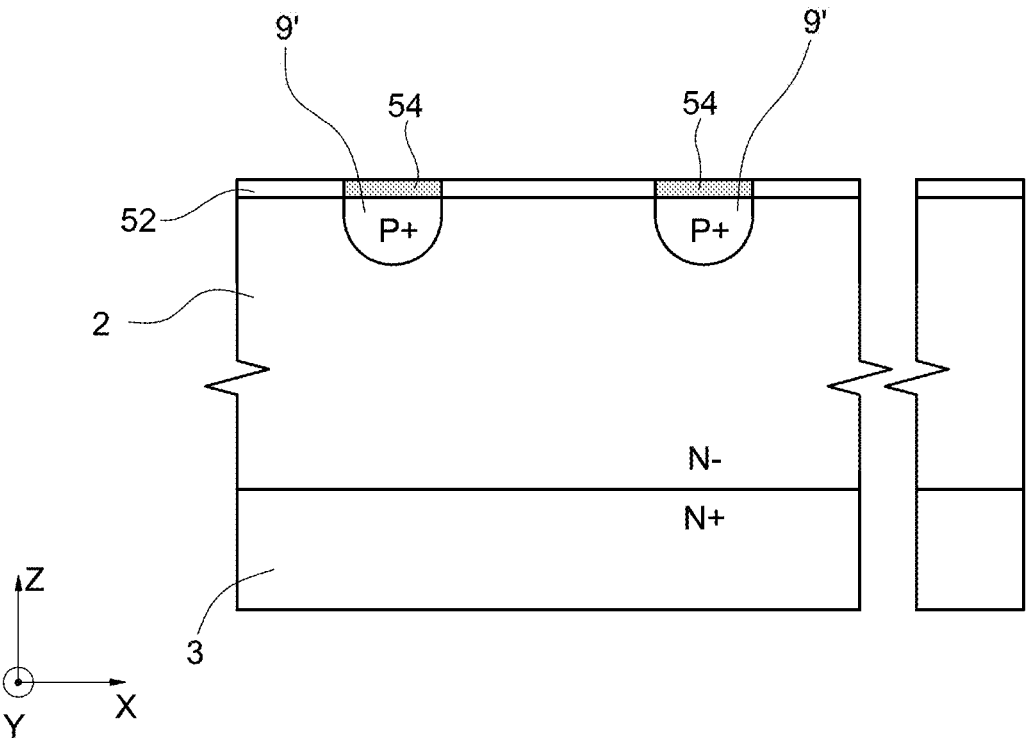

After the step of FIG. 6D, the method proceeds with steps of forming (e.g., by deposition) the anode metallization 8, for example of Ti/AlSiCu or Ni/AlSiCu, on the 3C-SiC layer 52, in direct electrical contact with the ohmic contacts 54. Then, the passivation layer 19 is formed on the anode metallization 8, to protect the latter. Consequently, respective Schottky diodes 57 are formed at the interface between the 3C-SiC layer 52 and the anode metallization 8, lateral to the ohmic contacts 57.

Figure 7:
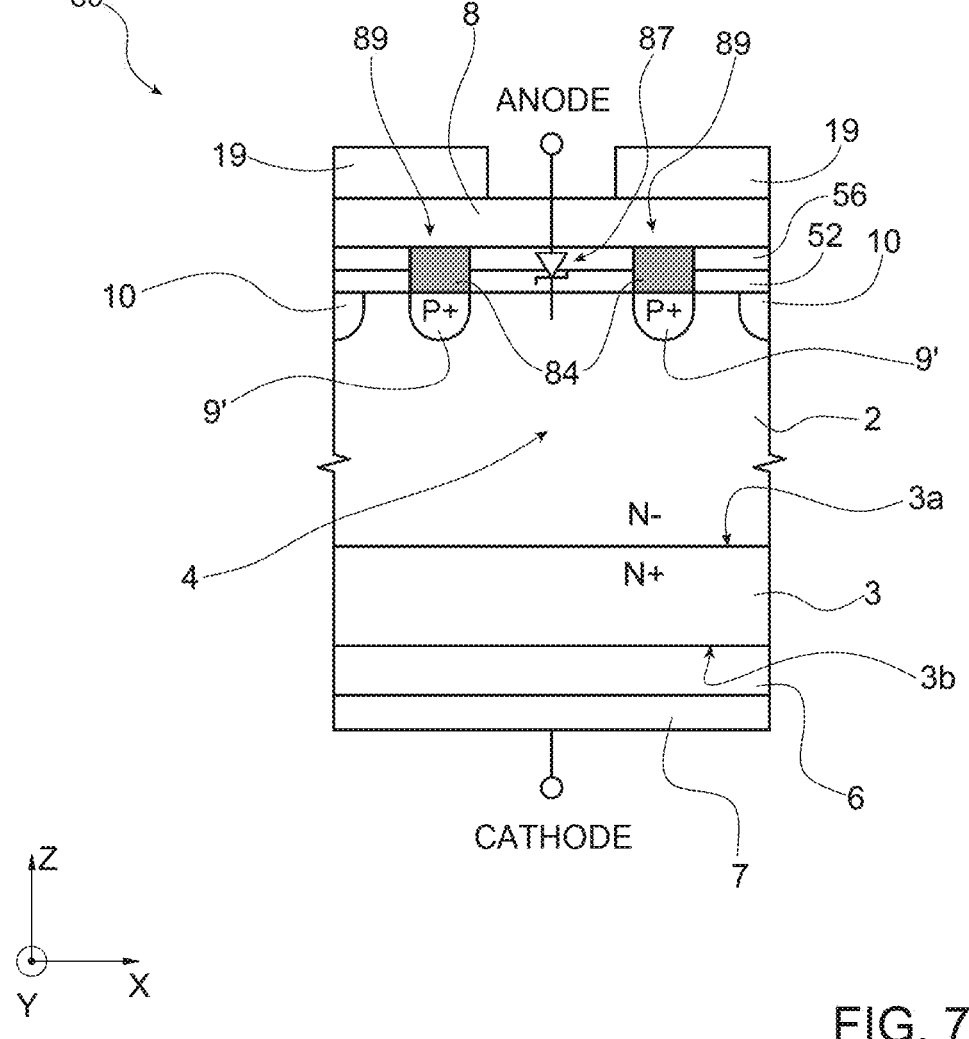
FIG. 7 shows, in cross-sectional view, a JBS or MPS device according to an embodiment.

FIG. 7 shows, in lateral sectional view in the Cartesian (triaxial) reference system of X, Y, Z axes of FIG. 1 and FIG. 4, a JBS device 80, according to an embodiment of the present disclosure.

Elements common to the JBS device 1 of FIG. 1 or to the JBS device 50 of FIG. 4 are identified with the same reference numbers and may not be described again.

The JBS device 80 includes: the substrate 3, of N-type 4H-SiC, having the first dopant concentration; the (epitaxial) drift layer 2, of N-type 4H-SiC, having the second dopant concentration; the cubic silicon carbide (3C-SiC) layer 52 on the surface 2a; the silicon layer 56 on the 3C-SiC layer 52; the anode metallization 8, for example of Ti/AlSiCu or Ni/AlSiCu, which extends on the silicon layer 56; the passivation layer 19 on the anode metallization 8; the plurality of implanted regions 9' in the drift layer 2, facing the top surface 2a of the drift layer 2, at the interface with the 3C-SiC layer 52; a plurality of ohmic contacts 84, extending through the 3C-SiC layer 52 and through the silicon layer 56 at respective implanted regions 9' and forming, with the latter, respective JB elements 89; the edge termination region, or protection ring, 10 (optional), in particular a P-type implanted region, which completely or partially surrounds the JB elements 9; the ohmic contact region, or layer 6 (for example of Nickel Silicide), which extends on the surface 3b of the substrate 3; the cathode metallization 7, for example of Ti/NiV/Ag or Ti/NiV/Au, which extends on the ohmic contact region 6.

One or more Schottky diodes 87 extend at the interface between the silicon layer 56 and the anode metallization 8, lateral to the implanted regions 9'. In particular, one or more Schottky (semiconductor-metal) junctions are formed by portions of the silicon layer 56 in direct electrical contact with respective portions of the anode metallization 8.

The region of the JBS device 80 which includes the JB elements 89 and the Schottky diodes 87 (i.e., the region contained within the protection ring 10, if any) is the active area 4 of the JBS device 80.

Figure 8A:
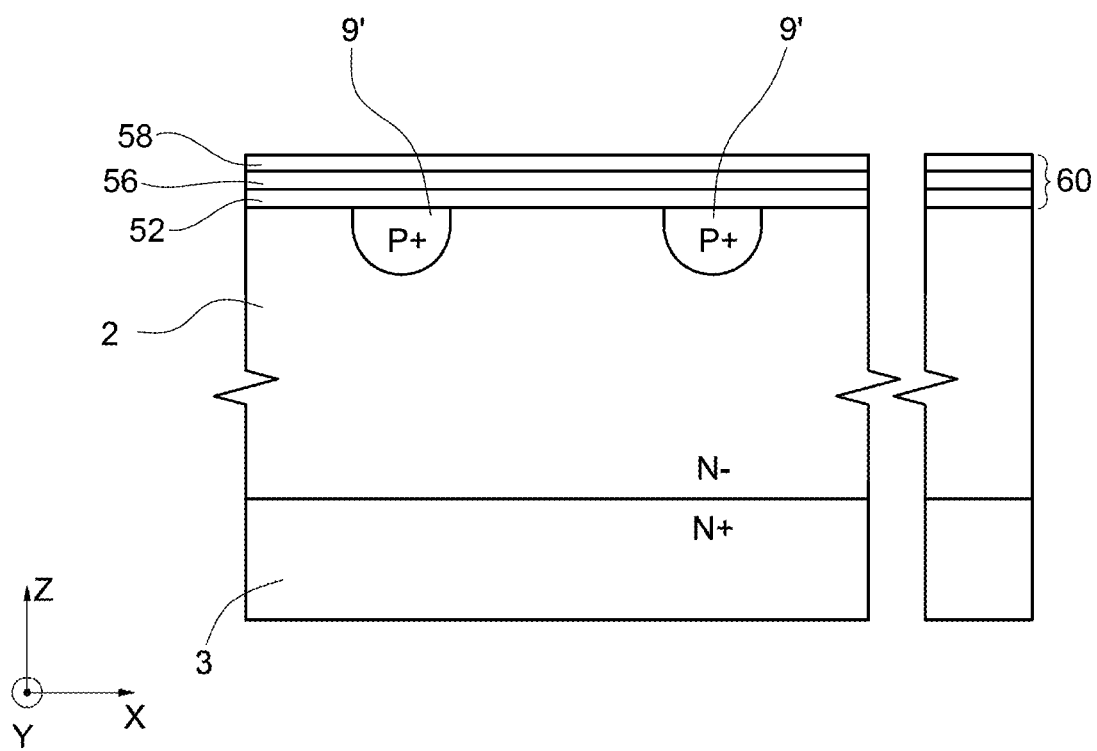
FIGS. 8A-8C show, in cross-sectional view, intermediate manufacturing steps of the device of FIG. 7, according to an embodiment.
Figure 8B:
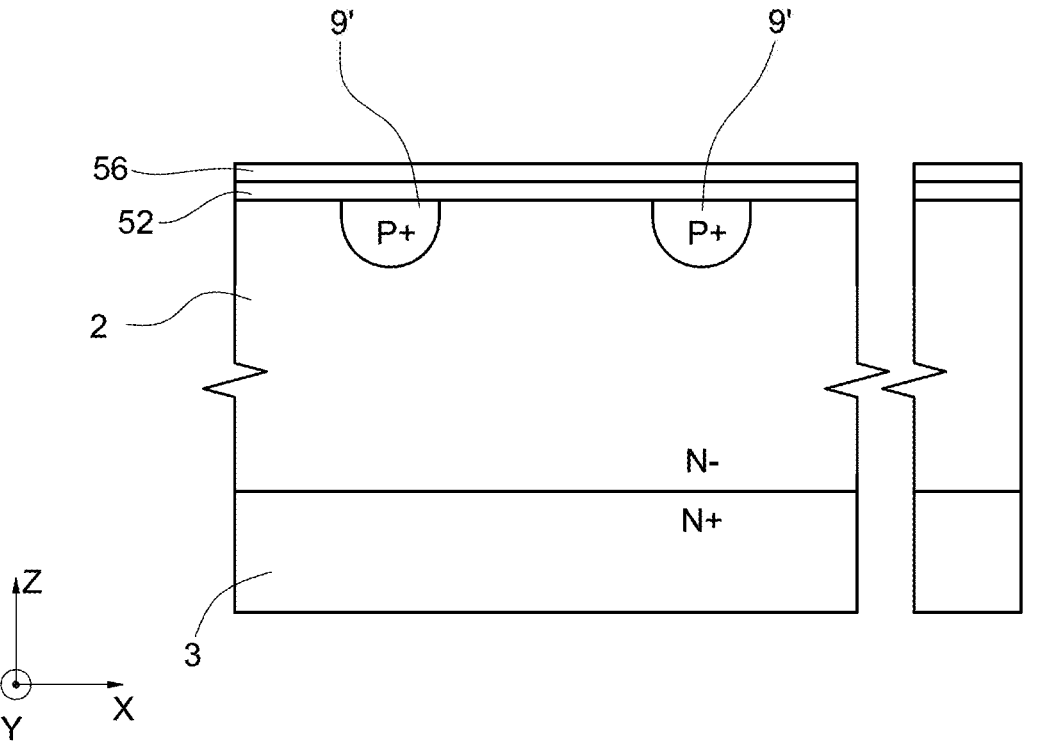
Figure 8C:
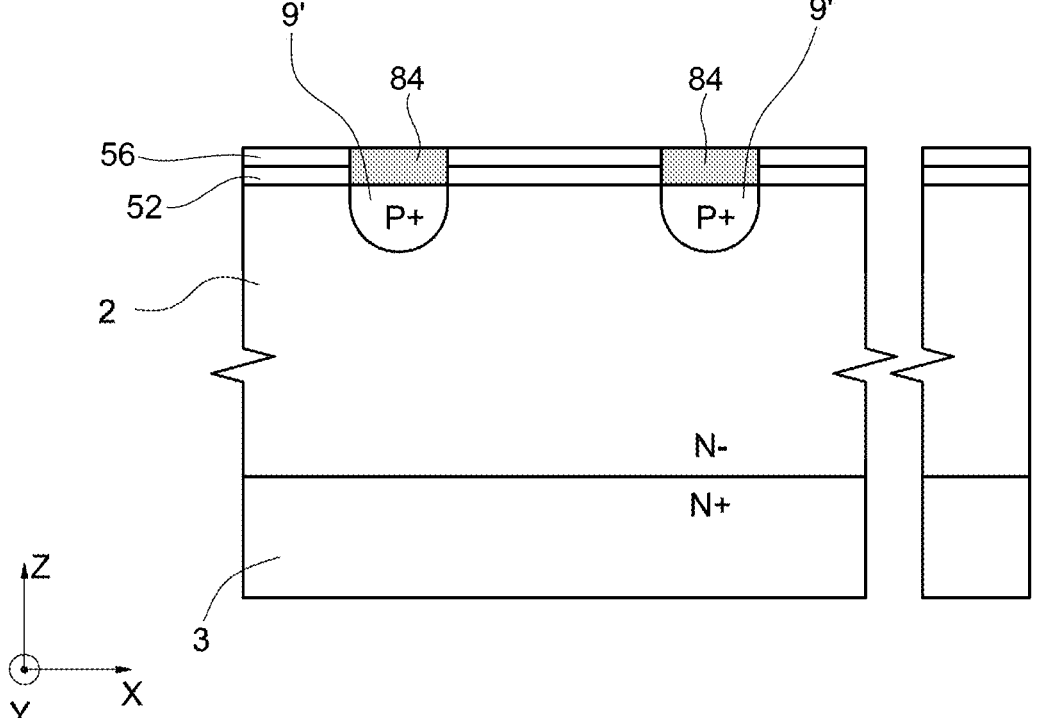

FIGS. 8A-8C show, in lateral sectional view in the Cartesian (triaxial) reference system of X, Y, Z axes, intermediate manufacturing steps of the JBS device 80, according to an embodiment of the present disclosure.

In this case, the steps of forming the cubic silicon carbide (3C-SiC) layer 52 and the silicon layer 56 occur by melting and resolidification (crystallization) of the 4H-SiC material of the drift layer 2, as already discussed with reference to FIGS. 5A-5D.

As illustrated in FIG. 8A (which corresponds to FIG. 5A), initially this process leads to the formation of the same stack already described for FIG. 6A, i.e., including the 3C-SiC layer 52 on the drift layer 2 of 4H-SiC, the silicon layer 56 on the 3C-SiC layer 52, and the carbon-rich (for example Graphite) layer 58 on the silicon layer 56.

Then, FIG. 8B, a step of selectively removing the carbon-rich layer 58, but not the underlying silicon layer 56, is performed. This step is performed for example by plasma etching process in $O_2$ environment. Other chemistries or methods for selectively removing graphite may be used.

Then, FIG. 8C, the ohmic contacts 84 are formed through the silicon layer 56 and the 3C-SiC layer 52, at the implanted regions 9' (and possibly at the protection ring 10, if any). To this end, the process already described with reference to FIGS. 3A-3C is used, suitably modified to adapt it to the case discussed herein. In particular, in this case, the mask 13 is formed on the silicon layer 56 and the through openings 13a extend up to reaching the silicon layer 56. Therefore, the metal layer 14 extends up to reaching the silicon layer 56.

Using a suitably configured LASER source, it is possible to simultaneously melt the surface portion of the drift layer 2 (to form the 3C-SiC layer 52 and the silicon layer 56 as described above) and activate the doping species of the implanted regions 9'. The relevant LASER configuration parameters are the following: an energy density equal to, or greater than, 2.4 $J/cm^2$ (considered at the level of the top surface 2a), a number of pulses between 1 and 16, for example equal to 4, a time duration of each pulse between 20 and 500 ns, for example equal to 160 ns, and a wavelength of the emitted radiation between 240 and 700, for example equal to 308 nm.

In this embodiment, the step of activating the dopants in a furnace described with reference to FIG. 2B, may be omitted.

After the step of FIG. 8C, the method proceeds with steps of forming (e.g., by deposition) the anode metallization 8, for example of Ti/AlSiCu or Ni/AlSiCu, on the silicon layer 56, in direct electrical contact with the ohmic contacts 84. Then, the passivation layer 19 is formed on the anode metallization 8, to protect the latter. Consequently, respective Schottky diodes 87 are formed at the interface between the silicon layer 56 and the anode metallization 8, lateral to the ohmic contacts 84.

From an examination of the characteristics of the disclosure provided according to the present description, the advantages that it affords are evident.

In particular, it is possible to take full advantage of the advantages of a 4H-SiC substrate in combination with the advantages resulting from the reduced bandgap value of 3C-SiC or silicon (in the respective embodiments) for the formation of the JB elements and the Schottky contacts, as previously discussed.

Finally, it is clear that modifications and variations may be made to what has been described and illustrated herein, without thereby departing from the scope of the present disclosure, as defined in the attached claims.

For example, the steps of melting 4H-SiC described with reference to FIGS. 6A and 8A may be performed in the absence of the implanted regions 9'. In this case, therefore, the epitaxial layer 2 does not accommodate the implanted regions 9', which are formed:

i) after the step of removing the silicon 56 and carbon 58 layers (i.e., immediately after the step of FIG. 6C, for the respective embodiment); or ii) after the step of removing the carbon-rich layer 58 (i.e., immediately after the step of FIG. 8B, for the respective embodiment).

Moreover, the present disclosure is not limited to the manufacturing of 3C-SiC JBS devices, but extends to the formation of ohmic contacts in generic electronic devices, such as for example a MOSFET (in particular a vertical channel MOSFET), an IGBT, a JFET, a DMOS, a Merged-PN-Schottky (MPS) diode, etc. Forming the channel of a vertical MOSFET in a 3C-SiC layer (instead of in other SiC polytypes, such as 4H-SiC) brings a considerable advantage in terms of output resistance of the device, due to the different electron mobility between 3C-SiC and 4H-SiC.

In one embodiment, a method for manufacturing an electronic device may be summarized as including the steps of forming, at a front side of a solid body of 4H-SiC having a first electrical conductivity (N), at least one implanted region having a second electrical conductivity (P) opposite to the first electrical conductivity (N); forming, on the front side, a 3C-SiC layer; and forming, in the 3C-SiC layer, an ohmic contact region which extends through the entire thickness of the 3C-SiC layer, up to reaching the implanted region.

Forming the 3C-SiC layer may include performing a step of growing 3C-SiC by VLS technique or SE technique.

Forming the 3C-SiC layer may include heating, through a LASER beam, at least one portion of the front side of the solid body, at least up to a melting temperature of the 4H-SiC material; and allowing the cooling and crystallization of the melted portion of the solid body, forming a stack of superimposed layers including: the 3C-SiC layer in contact with the solid body, a silicon layer on the 3C-SiC layer, and a carbon-rich layer on the silicon layer.

The method may further include the step of completely removing the carbon-rich layer and the silicon layer, exposing the 3C-SiC layer.

Completely removing the carbon-rich layer and the silicon layer may include performing a step of oxidating the silicon layer and the carbon-rich layer, and a subsequent step of etching the oxidized silicon layer and the oxidized carbon-rich layer.

The method may further include the step of completely removing the carbon-rich layer exposing the silicon layer.

Completely removing the carbon-rich layer may include performing a selective etching for removing the carbon-rich layer preserving the silicon layer.

The method may further include the step of forming the ohmic contact region also through the entire thickness of the silicon layer, up to reaching the implanted region.

The method may further include the step of forming, on the 3C-SiC layer and on the ohmic contact region, a metal layer, thus forming a Schottky diode between the metal layer and the 3C-SiC layer and, simultaneously, a junction-barrier, JB, diode between the metal layer and the ohmic contact region.

The method may further include the steps of forming, at the metal layer, a first electrical terminal common to the JB diode and Schottky diode; and forming, at a rear side opposite to the front side of the solid body, a second electrical terminal common to the JB diode and Schottky diode.

The electronic device may be one of: a Merged-PiN-Schottky, MPS, device; a Junction Barrier Schottky, JBS, device; a MOSFET; an IGBT; a JFET; a DMOS.

An electronic device, may be summarized as including a solid body of 4H-SiC having a first electrical conductivity (N); at least one implanted region having a second electrical conductivity (P) opposite to the first electrical conductivity (N) extending at a front side of the solid body; a 3C-SiC layer on the front side; and an ohmic contact region through the entire thickness of the 3C-SiC layer, up to reaching the implanted region.

The device may further include a silicon layer on the 3C-SiC layer, the ohmic contact region also extending through the entire thickness of the silicon layer, up to reaching the implanted region.

The solid body may include a substrate of 4H-SiC; and an epitaxial layer of 4H-SiC on the substrate, wherein the epitaxial layer is a drift layer of the electronic device.

The first electrical conductivity may be of N-type, and the second electrical conductivity is of P-type.

The device may further include a metal layer on the 3C-SiC layer and on the ohmic contact region, thus forming a Schottky diode between the metal layer and the 3C-SiC layer and a junction-barrier, JB, diode between the metal layer and the ohmic contact region.

The device may further include a first electrical terminal common to the JB diode and Schottky diode at the metal layer; and a second electrical terminal common to the JB diode and Schottky diode at a rear side opposite to the front side of the solid body.

The electronic device may be one of: a Merged-PIN-Schottky, MPS, device; a Junction Barrier Schottky, JBS, device; a MOSFET; an IGBT; a JFET; a DMOS.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for manufacturing an electronic device, the method comprising:
   forming, at a front side of a solid body of 4H-SiC having a first electrical conductivity, at least one implanted region having a second electrical conductivity opposite to the first electrical conductivity;
   forming, on the front side, a 3C-SiC layer; and
   forming, in the 3C-SiC layer, an ohmic contact region extending through an entire thickness of the 3C-SiC layer, up to reaching the implanted region.

2. The method according to claim 1, wherein forming the 3C-SiC layer includes growing 3C-SiC by a vapor-liquid-sold technique or a sublimation epitaxy technique.

3. The method according to claim 1, wherein forming the 3C-SiC layer includes:
   heating, through a LASER beam, at least one portion of the front side of the solid body, at least up to a melting temperature of the 4H-SiC material; and
   allowing the cooling and crystallization of the melted portion of the solid body, forming a stack of superimposed layers including: the 3C-SiC layer in contact with the solid body, a silicon layer on the 3C-SiC layer, and a carbon-rich layer on the silicon layer.

4. The method according to claim 3, further comprising completely removing the carbon-rich layer and the silicon layer, exposing the 3C-SiC layer.

5. The method according to claim 4, wherein completely removing the carbon-rich layer and the silicon layer includes oxidating the silicon layer and the carbon-rich layer, and subsequently etching the oxidized silicon layer and the oxidized carbon-rich layer.

6. The method according to claim 3, further comprising completely removing the carbon-rich layer exposing the silicon layer.

7. The method according to claim 6, wherein completely removing the carbon-rich layer includes performing a selective etching for removing the carbon-rich layer preserving the silicon layer.

8. The method according to claim 6, further comprising forming the ohmic contact region also through the entirety of the thickness of the silicon layer, up to reaching the implanted region.

9. The method according to claim 1, further comprising forming, on the 3C-SiC layer and on the ohmic contact region, a metal layer, thus forming a Schottky diode between the metal layer and the 3C-SiC layer and, simultaneously, a junction-barrier, JB, diode between the metal layer and the ohmic contact region.

10. The method according to claim 9, further comprising:

forming, at the metal layer, a first electrical terminal common to the JB diode and Schottky diode; and forming, at a rear side opposite to the front side of the solid body, a second electrical terminal common to the JB diode and Schottky diode.

11. The method according to claim 1, wherein the electronic device is one of: a Merged-PiN-Schottky, MPS, device; a Junction Barrier Schottky, JBS, device; a MOSFET; an IGBT; a JFET; a DMOS.

12. A method, comprising:

forming a body of SiC having a first crystal structure and a first conductivity type; forming forming an implanted region having a second electrical conductivity opposite to the first electrical conductivity at a front surface of the body of SiC;

forming, on the front surface of the body of SiC, a layer of SiC having a second crystal structure different from the first crystal structure; and forming an ohmic contact region extending from a front surface of the layer of SiC to the implanted region at a back surface of the layer of SiC;

forming a first metalization layer over the layer of SiC; and forming a second metalization layer below the body of SiC.

13. The method of claim 12, wherein the first crystal structure is 4H-SiC and the second crystal structure is 3C-SiC.

14. The method of claim 12, further comprising:

forming a silicon layer on the layer of SiC;

forming the ohmic contact region extending through an entire thickness of the silicon.

15. The method of claim 12, wherein the body of SiC includes:

a substrate of 4H-SiC; and an epitaxial layer of 4H-SiC on the substrate, wherein the epitaxial layer is a drift layer of the electronic device.

16. The method of claim 12, wherein the first electrical conductivity is of N-type, and the second electrical conductivity is of P-type.

17. The method of claim 12, comprising forming a Schottky diode between the metal layer and the 3C-SiC layer and a junction-barrier, JB, diode between the first metalization layer and the ohmic contact region.

18. The method of claim 17, further comprising:

forming a first electrical terminal common to the JB diode and Schottky diode at the first metalization layer; and forming a second electrical terminal common to the JB diode and Schottky diode at the second metalization layer.

19. A method, comprising:

forming a body of 4H-SiC having a first conductivity type;

forming an implanted region of a second conductivity type in the body extending from a top surface of the body;

forming a layer of 3C-SiC on the top surface of the body;

forming a layer of silicon on the layer of 3C-SiC;

forming an ohmic contact extending through layer of 3C-SiC and the layer of silicon and contacting the implanted region;

forming an anode metalization on the ohmic contact and corresponding to an anode of a Schottky diode; and forming a cathode metalization below the body and corresponding to a cathode of the Schottky diode.

20. The method of claim 19, further comprising forming a protection ring of the second conductivity type extending downward from the top surface of the body and laterally surrounding the implanted region.

\*   \*   \*   \*   \*